(12) United States Patent
Ishida et al.

(10) Patent No.: US 12,442,753 B2
(45) Date of Patent: Oct. 14, 2025

(54) ENVIRONMENT FORMING DEVICE

(71) Applicant: ESPEC CORP., Osaka (JP)

(72) Inventors: Masaaki Ishida, Osaka (JP); Masataka Nakanishi, Osaka (JP); Jun Hirai, Osaka (JP)

(73) Assignee: ESPEC CORP., Osaka (JP)

( * ) Notice: Subject to any disclaimer, the term of this patent is extended or adjusted under 35 U.S.C. 154(b) by 314 days.

(21) Appl. No.: 18/181,638

(22) Filed: Mar. 10, 2023

(65) Prior Publication Data

US 2023/0296496 A1  Sep. 21, 2023

(30) Foreign Application Priority Data

Mar. 17, 2022  (JP) ................. 2022-042146

(51) Int. Cl.
*G01N 17/00* (2006.01)
(52) U.S. Cl.
CPC .................. *G01N 17/002* (2013.01)
(58) Field of Classification Search
USPC ........................................ 73/865.6
See application file for complete search history.

(56) References Cited

U.S. PATENT DOCUMENTS

| | | | | |
|---|---|---|---|---|
| 3,664,181 A * | 5/1972 | Conrad | ...... | B01L 1/02 |
| | | | | 73/571 |
| 5,392,631 A * | 2/1995 | Elwell | ...... | G01P 21/00 |
| | | | | 250/221 |
| 5,675,098 A * | 10/1997 | Hobbs | ...... | G01M 7/02 |
| | | | | 73/865.6 |
| 2015/0090053 A1 | 4/2015 | Matsuguma et al. | | |
| 2015/0185121 A1 | 7/2015 | Kobayashi et al. | | |
| 2016/0169789 A1 * | 6/2016 | Chen | ...... | G01N 17/002 |
| | | | | 73/865.6 |

(Continued)

FOREIGN PATENT DOCUMENTS

| | | | | |
|---|---|---|---|---|
| CN | 112903572 A * | 6/2021 | ........... | G01N 17/002 |
| JP | H06-040844 U | 5/1994 | | |
| JP | H11-344432 A | 12/1999 | | |

(Continued)

OTHER PUBLICATIONS

An Office Action; "Notice of Reasons for Refusal," mailed by the Japanese Patent Office on Oct. 8, 2024, which corresponds to Japanese Patent Application No. 2022-042146 and is related to U.S. Appl. No. 18/181,638; with English language translation.

(Continued)

*Primary Examiner* — Daniel S Larkin
(74) *Attorney, Agent, or Firm* — Studebaker Brackett PLLC

(57) ABSTRACT

An environment forming device includes: a device body having a space for generating a predetermined environment; a door; and a slide mechanism that makes the door slidable with respect to the device body so as to open and close the space. The slide mechanism includes an extension member having an elongated shape fixed to the door, and a holding portion that is arranged on the device body and slidably holds the extension member. A reception portion for a sample is arranged on the door such that the sample is arranged in the space in a state where the door closes the space. The extension member is positioned below the reception portion.

9 Claims, 11 Drawing Sheets

(56) References Cited

U.S. PATENT DOCUMENTS

2018/0217019 A1    8/2018   Furumoto et al.

FOREIGN PATENT DOCUMENTS

| | | |
|---|---|---|
| JP | 2001-174508 A | 6/2001 |
| JP | 2001-249068 A | 9/2001 |
| JP | 2001-318046 A | 11/2001 |
| JP | 2003-270281 A | 9/2003 |
| JP | 2015-068734 A | 4/2015 |
| WO | 2016/195111 A1 | 12/2016 |

OTHER PUBLICATIONS

The extended European search report issued by the European Patent Office on Aug. 21, 2023, which corresponds to European Patent Application No. 23162238.2-1101 and is related to U.S. Appl. No. 18/181,638.

* cited by examiner

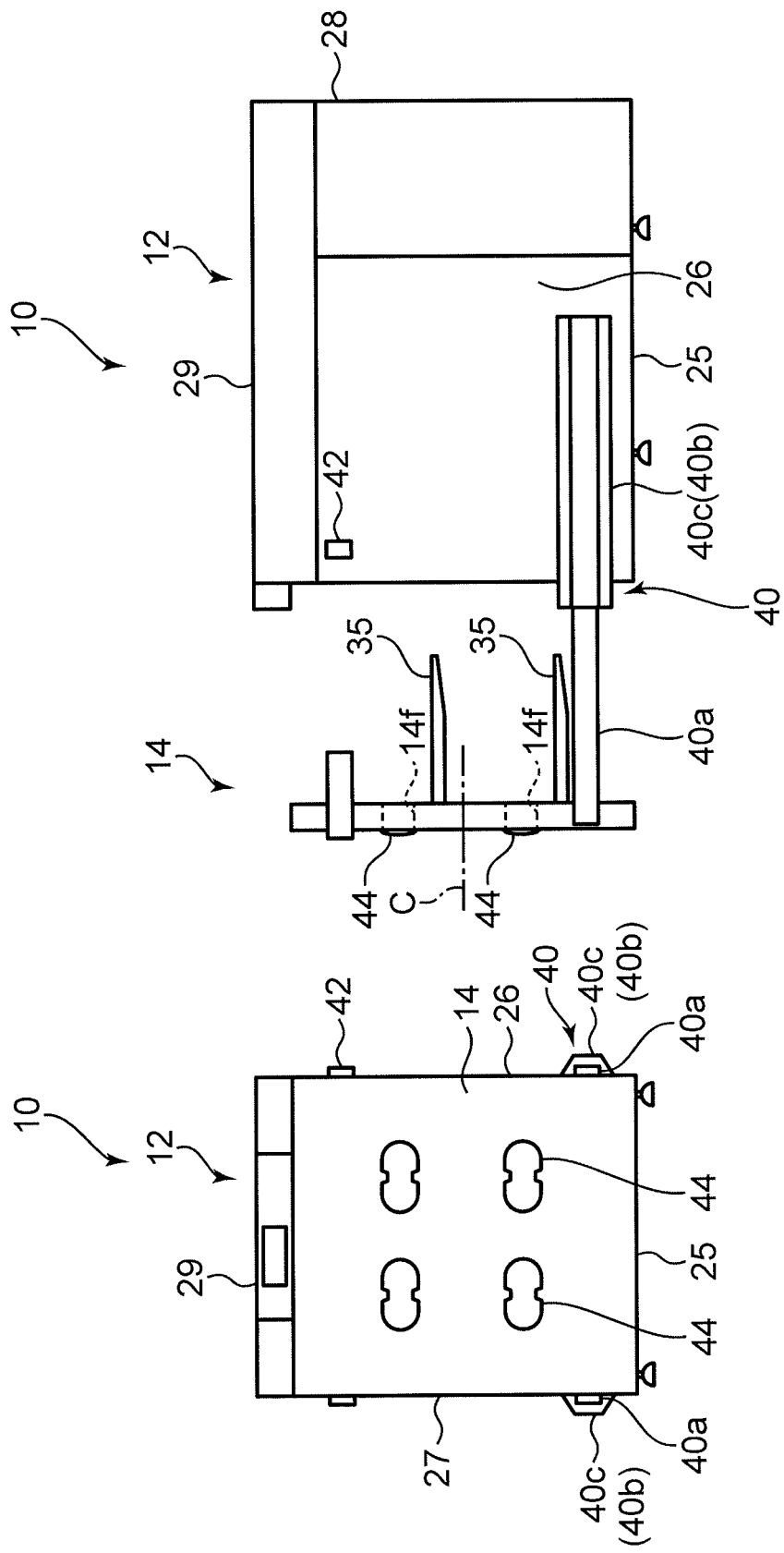

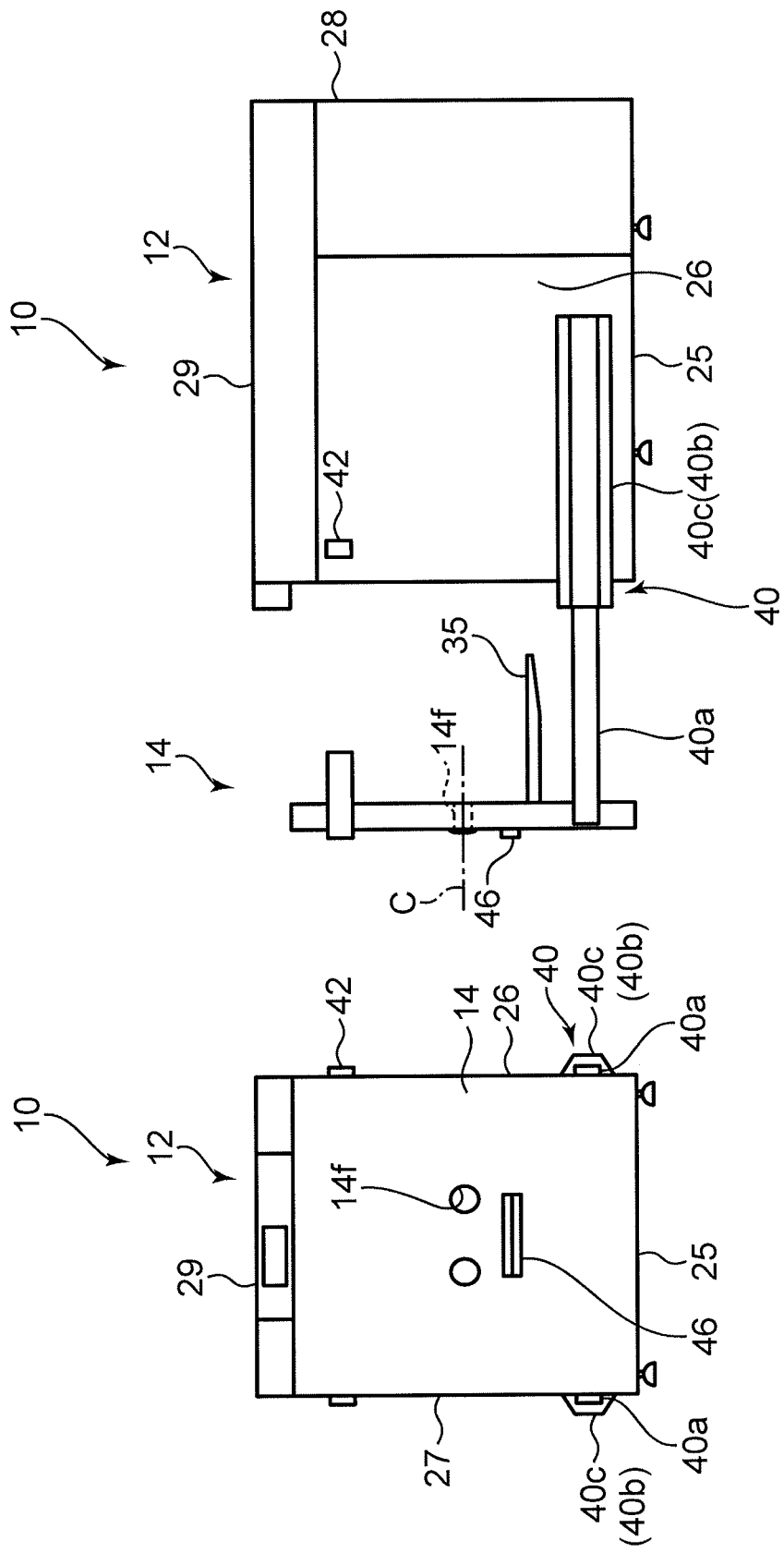

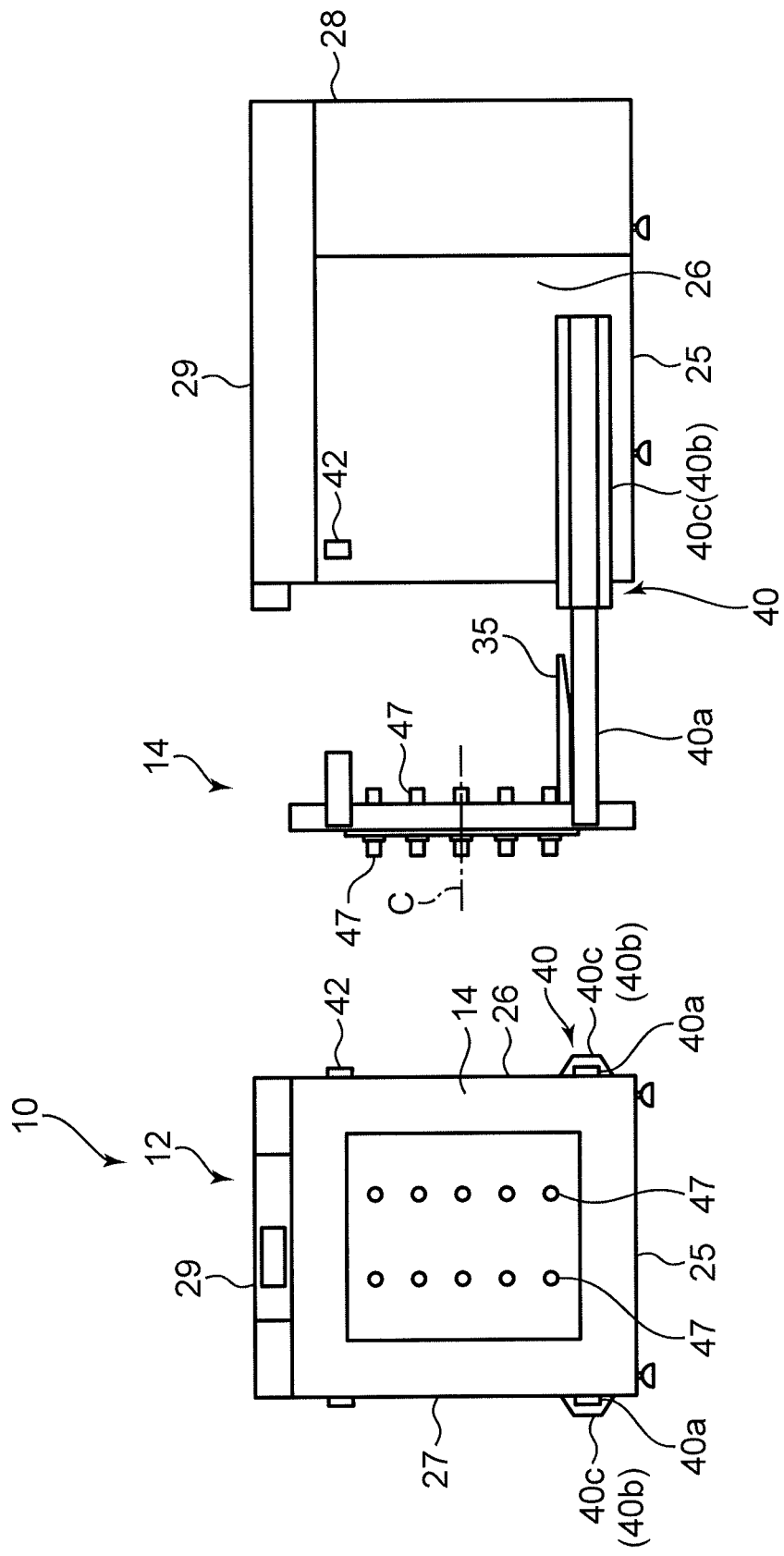

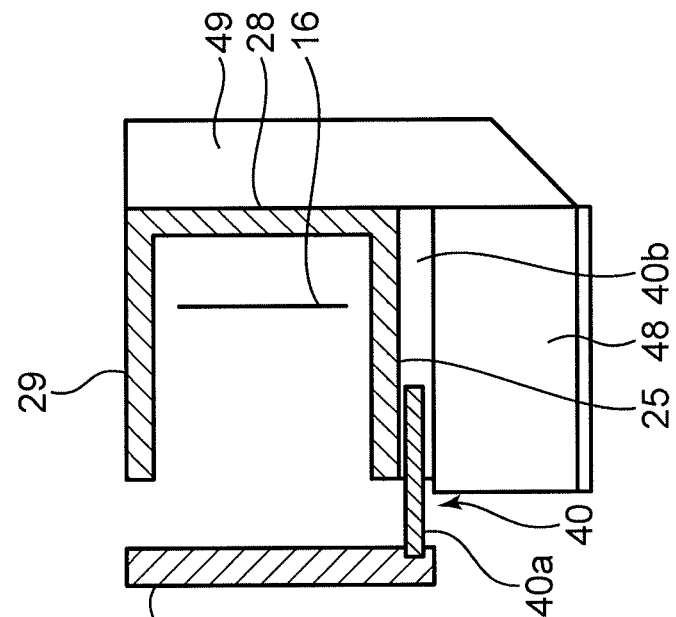
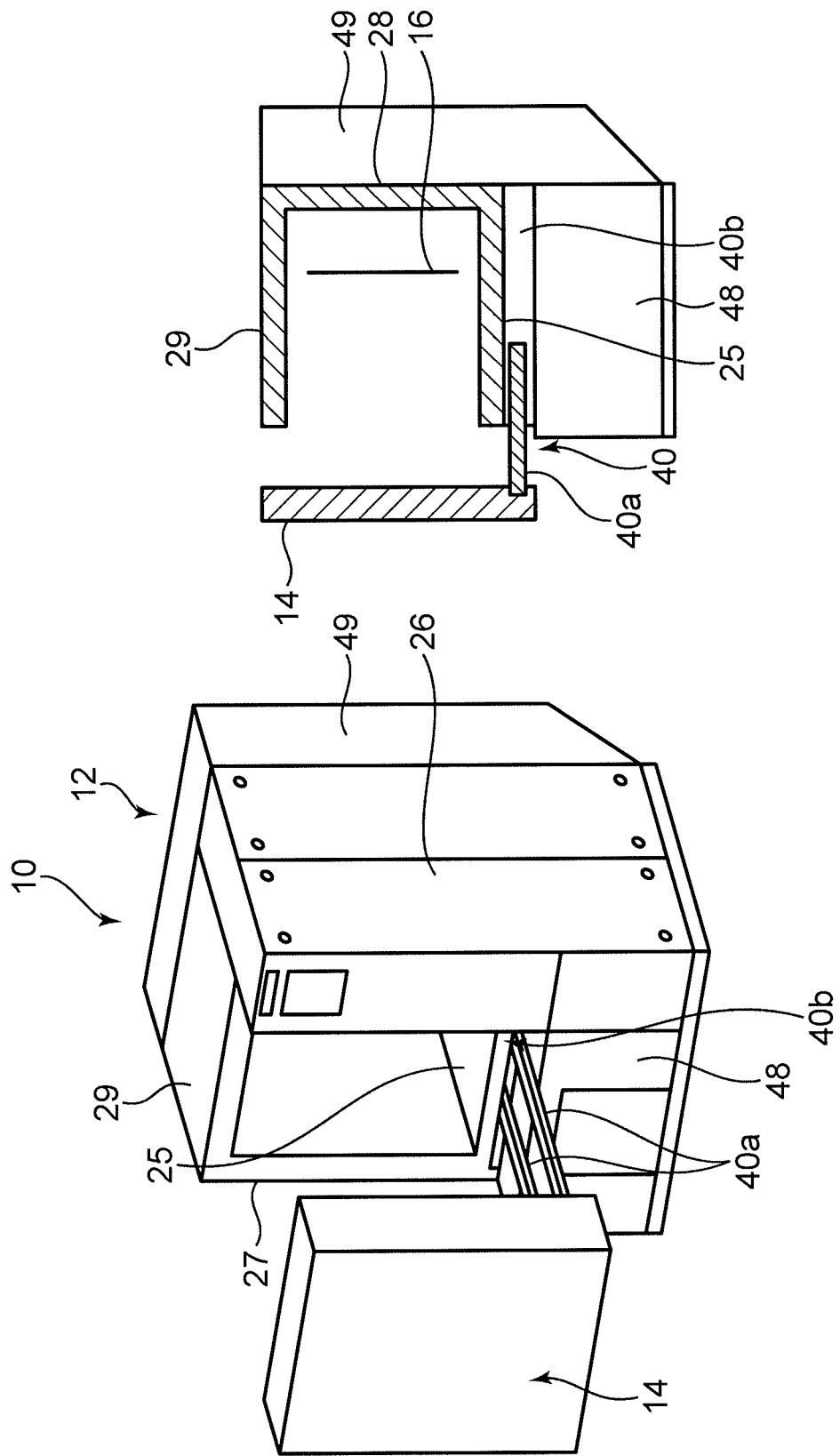
FIG.8B
FIG.8A

ENVIRONMENT FORMING DEVICE

CROSS-REFERENCE TO RELATED APPLICATIONS

This application is based on Japanese Patent Application No. 2022-42146 filed on Mar. 17, 2022, the contents of which are hereby incorporated by reference.

TECHNICAL FIELD

The present invention relates to an environment forming device.

BACKGROUND ART

Conventionally, as disclosed in JP H11-344432 A, there is known an environment forming device including a device body having a space for generating a predetermined temperature environment, and a sliding door that opens and closes this space. In the environment forming device disclosed in JP H11-344432 A, as shown in FIG. 11, an extension member 82 is fixed to each of left and right ends of a door 81, and the pair of extension members 82 slide along a slide rail 84 provided in a device body 83. A sample stage 85 for placing a sample is fixed to the door 81, and when the door 81 is pulled out from the device body 83, the sample stage 85 is also pulled out from the space in the device body 83. Therefore, work of connecting the wire to the sample such as a printed circuit board can be performed in a state where the sample is placed on the sample stage 85 if the door 81 is in a state of being pulled out from the device body 83.

In the environment forming device disclosed in JP H11-344432 A, the sample stage 85 is attached to the door 81 that slides with respect to the device body 83. Therefore, if the door 81 is pulled out from the device body 83, work such as connection can be performed in the state where the sample is placed on the sample stage 85. However, since the extension member 82 is arranged to each of left and right ends of the door 81, and this extension member 82 not only has a predetermined width in an up-down direction but also is positioned at the same height as the sample stage 85, there is a problem that the extension members 82 hinder the work when the sample is accessed from the side of the environment forming device, for example.

BACKGROUND ART

Conventionally, as disclosed in JP H11-344432 A, there is known an environment forming device including a device body having a space for generating a predetermined temperature environment, and a sliding door that opens and closes this space. In the environment forming device disclosed in JP H11-344432 A, as shown in FIG. 11, an extension member 82 is fixed to each of left and right ends of a door 81, and the pair of extension members 82 slide along a slide rail 84 provided in a device body 83. A sample stage 85 for placing a sample is fixed to the door 81, and when the door 81 is pulled out from the device body 83, the sample stage 85 is also pulled out from the space in the device body 83. Therefore, a work of connecting the wire to the sample, such as a printed circuit board, can be performed in a state where the sample is placed on the sample stage 85 if the door 81 is in a state of being pulled out from the device body 83.

In the environment forming device disclosed in JP H11-344432 A, the sample stage 85 is attached to the door 81 that slides with respect to the device body 83. Therefore, if the door 81 is pulled out from the device body 83, a work such as connecting wires can be performed in the state where the sample is placed on the sample stage 85. However, since the extension member 82 is arranged to each of left and right ends of the door 81, and this extension member 82 not only has a predetermined width in an up-down direction but also is positioned at the same height as the sample stage 85, there is a problem that the extension members 82 hinder the work when the sample is accessed from the side of the environment forming device, for example.

SUMMARY OF THE INVENTION

An object of the present invention is to prevent an extension member fixed to a sliding door in an environment forming device having the sliding door from hindering when a sample is accessed.

An environment forming device according to one aspect of the present invention includes: a device body having a space for generating a predetermined environment; a door; and a slide mechanism that makes the door slidable with respect to the device body so as to open and close the space. The slide mechanism includes an extension member having an elongated shape fixed to the door, and a holding portion that is arranged on the device body and slidably holds the extension member. The environment forming device further includes a reception portion that is arranged on the door such that a sample is arranged in the space in a state where the door closes the space, and receives the sample. The extension member is positioned below the reception portion.

BRIEF DESCRIPTION OF DRAWINGS

FIG. 5A is a front view of an environment forming device according to another embodiment;

FIG. 5B is a side view of the environment forming device according to another embodiment;

FIG. 6A is a front view of an environment forming device according to another embodiment;

FIG. 6B is a side view of the environment forming device according to another embodiment;

FIG. 7A is a front view of an environment forming device according to another embodiment;

FIG. 7B is a side view of the environment forming device according to another embodiment;

FIG. 8A is a perspective view schematically showing an environment forming device according to another embodiment;

FIG. 8B is a view for describing an inside of the environment forming device according to another embodiment;

DETAILED DESCRIPTION

Embodiments for carrying out the present invention will be described below in detail with reference to the drawings.

An environment forming device according to the present embodiment is configured as an environment testing device, such as a temperature chamber, for exposing a sample to a predetermined temperature environment and applying a thermal load to the sample. The environment forming device is not limited to an environment testing device, such as a temperature chamber, and may be configured as a temperature and humidity chamber that exposes a sample to a predetermined temperature and humidity environment, or may be configured as a burn-in device that applies electrical stress (power voltage, signal, and the like) to a sample, such as an electronic device, under a high temperature environment. That is, the environment forming device is at least required to be a device that adjusts an ambient environment of a sample to a predetermined temperature environment and applies a thermal load to the sample.

Figure 1:
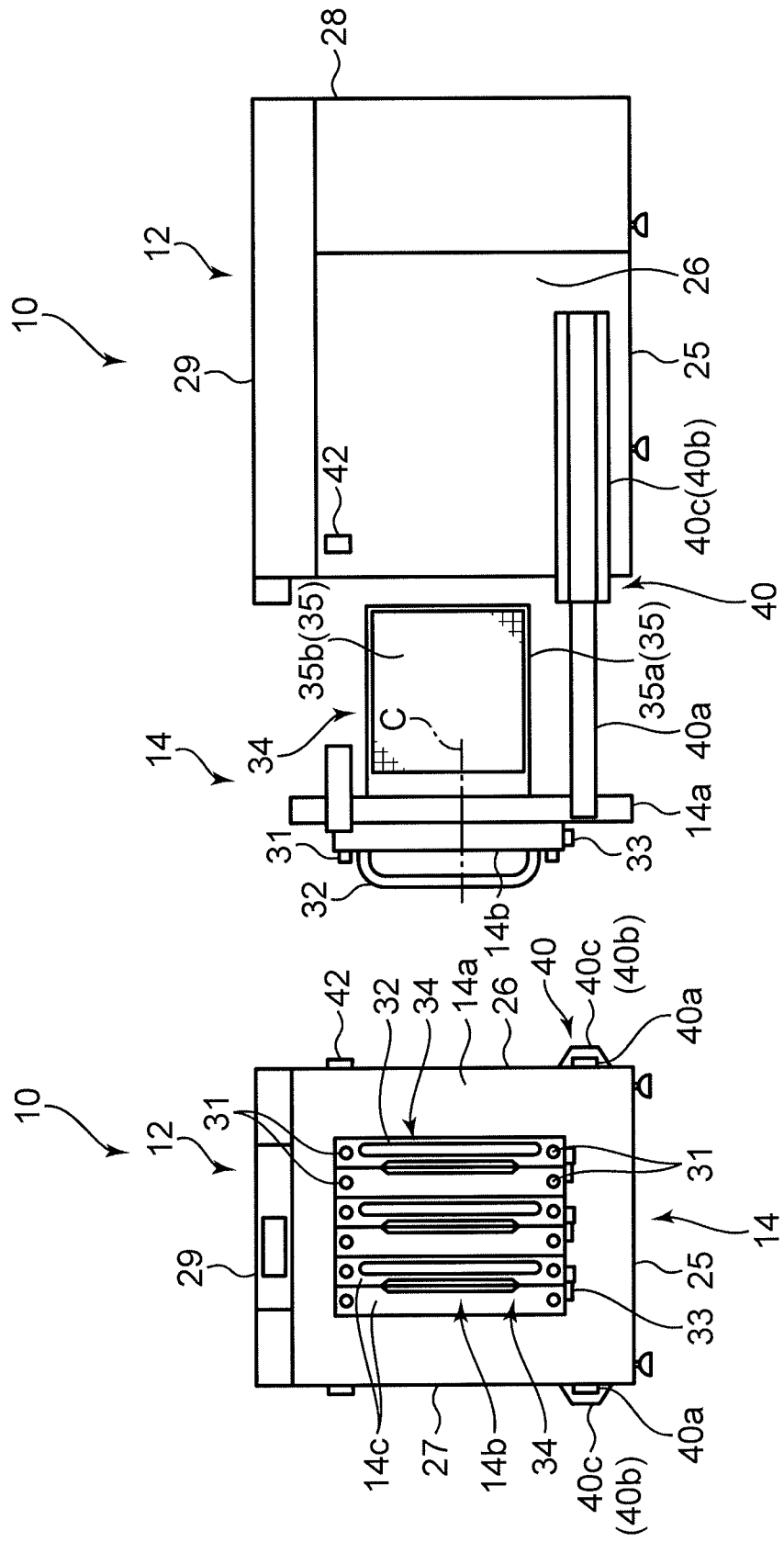
FIG. 1A is a front view of an environment forming device according to the present embodiment.
FIG. 1B is a side view of the environment forming device.

As shown in FIGS. 1A and 1B, an environment forming device 10 includes a device body 12 having a space (a test space S1, see FIG. 2) opened in one direction, and a door 14 capable of opening and closing an open end of the test space S1.

Figure 2:
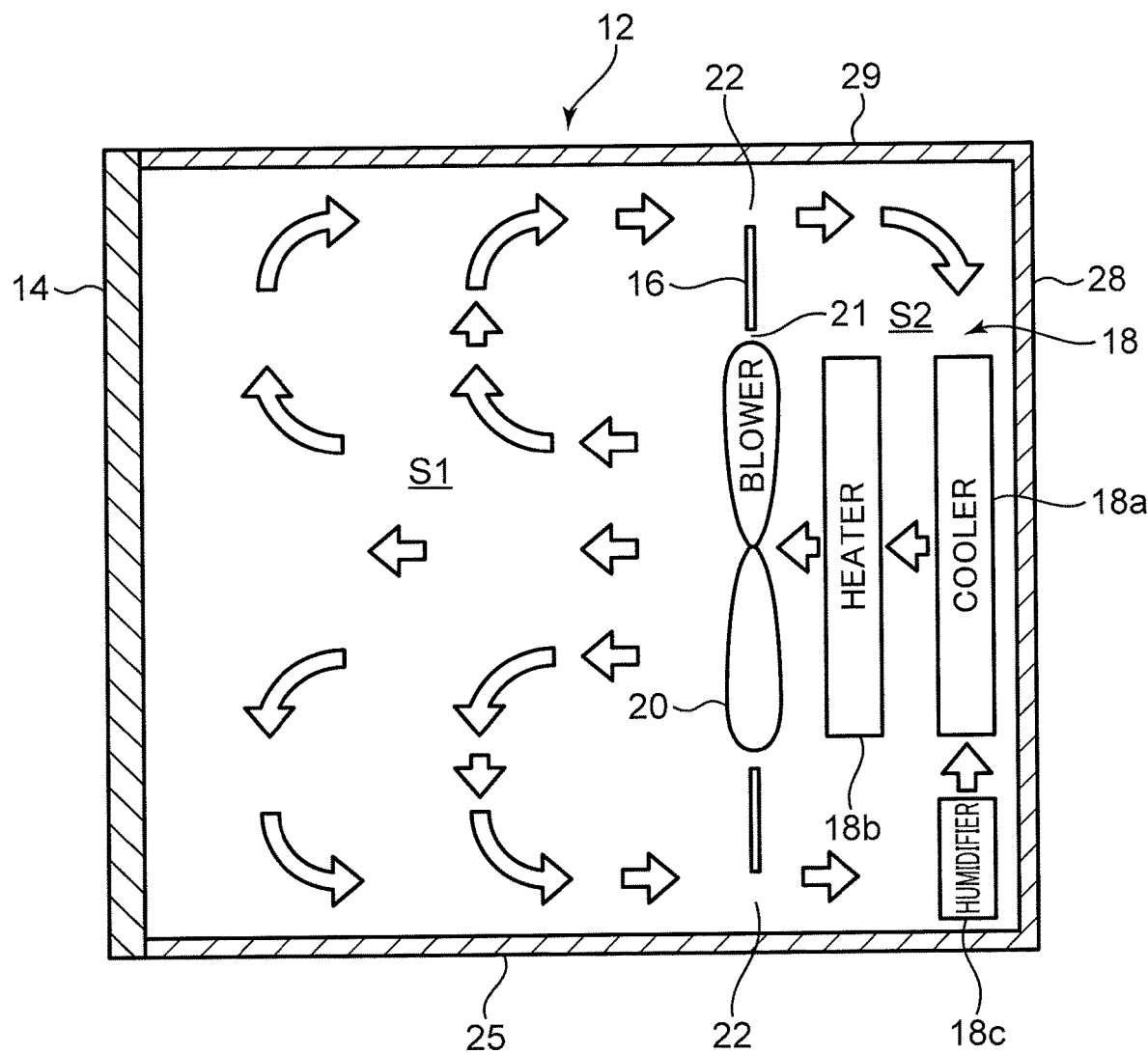
FIG. 2 is a view for describing an internal configuration of the environment forming device.

As shown in FIG. 2, the device body 12 is also provided with an air-condition space S2 communicating with the test space S1 in addition to the test space S1. The test space S1 and the air-condition space S2 are partitioned from each other by a partition wall 16. The test space S1 is opened forward, and the air-condition space S2 is positioned behind the test space S1, that is, on a side opposite to the open end.

The air-condition space S2 is provided with an air conditioner 18. The air conditioner 18 includes a cooler 18a for cooling air, a heater 18b for heating air, and a humidifier 18c for humidifying air. Since the cooler 18a is configured to cool air, it can also be used as an air dehumidifier. When the humidity of the air in the test space S1 needs not be adjusted, the humidifier 18c can be omitted.

The air air-conditioned by the air conditioner 18 is blown out into the test space S1 by a blower 20. The partition wall 16 is provided with a blow-out port 21 for introducing, into the test space S1, the air-conditioned air blown out from the blower 20, and a suction port 22 for returning the air in the test space S1 to the air-condition space S2. The blow-out port 21 is positioned at the center in the height direction, and a pair of the suction ports 22 are positioned above and below the blow-out port 21. Therefore, a part of the air blown out forward to the test space S1 from the center in the height direction by the blower 20 changes its orientation upward and flows rearward, and the remaining part changes its orientation downward and flows rearward. Then, the air in the test space S1 flows into the air-condition space S2 through the pair of upper and lower suction ports 22. The device body 12 is not limited to this configuration. For example, the blow-out port 21 may be formed at the upper end of the partition wall 16, and the suction port 22 may be formed at the lower end of the partition wall 16. In this case, the air blown out forward from the upper end of the partition wall 16 into the test space S1 by the blower 20 flows while gradually changing its orientation downward, flows rearward along the bottom plate (a bottom panel portion 25 described below) of the test space S1, and flows into the air-condition space S2 through the suction port 22 at the lower end. The blow-out port 21 may be positioned at the lower end, and the suction port 22 may be positioned at the upper end.

The device body 12 has a box shape having one opening. In the present embodiment, the device body 12 includes a box-shaped exterior having one opening, a box-shaped interior arranged in the exterior and having one opening, and a heat insulating material arranged in a space between the exterior and the interior.

The device body 12 includes a bottom panel portion 25, a left-side panel portion 26 rising from the edge of the left side (right side as viewed from the front) of the bottom panel portion 25, a right-side panel portion 27 rising from the edge of the right side (left side as viewed from the front) of the bottom panel portion 25, a backside panel portion 28 rising from the edge of the rear side of the bottom panel portion 25, and a ceiling panel portion 29 connecting the upper edges of the left-side panel portion 26, the right-side panel portion 27, and the backside panel portion 28. The partition wall 16 is arranged in front of the backside panel portion 28, a space on the front side of the partition wall 16 functions as the test space S1, and a space between the partition wall 16 and the backside panel portion 28 is the air-condition space S2.

The bottom panel portion 25 includes a bottom panel constituting a bottom surface of the exterior, a bottom panel constituting a bottom surface of the interior, and a heat insulating material positioned between both of the bottom panels. The left-side panel portion 26 includes a left-side panel constituting a left side surface (right side surface as viewed from the front) of the exterior, a left-side panel constituting a left side surface (right side surface as viewed from the front) of the interior, and a heat insulating material positioned between both of the left-side panels. The right-side panel portion 27 includes a right-side panel constituting a right side surface (left side surface as viewed from the front) of the exterior, a right-side panel constituting a right side surface (left side surface as viewed from the front) of the interior, and a heat insulating material positioned between both of the right-side panels. The backside panel portion 28 includes a backside panel constituting a back surface of the exterior, a backside panel constituting a back surface of the interior, and a heat insulating material positioned between both of the backside panels. The ceiling panel portion 29 includes a ceiling panel constituting a ceiling of the exterior, a ceiling panel constituting a ceiling of the interior, and a heat insulating material positioned between both of the ceiling panels. That is, the device body 12 may have a configuration in which a plurality of independent heat insulating panels (including an exterior panel, a heat insulating material, and an interior panel) are assembled in a box shape having one opening. Alternatively, the device body 12 may include an exterior in a box shape having one opening, an interior in a box shape having one opening and is arranged inside the exterior, and a heat insulating material arranged between the exterior and the interior.

The door 14 includes a door body 14a formed in a rectangular annular shape, and a closing part 14b inserted into the door body 14a to close an inner hole of the door body 14a. The door body 14a includes a heat insulating panel. This heat insulating panel also has a structure including a hollow exterior body formed of a metal exterior panel and a heat insulating material accommodated in the exterior body.

The closing part 14b includes an exterior body and a heat insulating material accommodated in the exterior body. The closing part 14b is a separate body from the door body 14a, and is detachable to the door body 14*a*. That is, the closing part 14*b* has a shape and a size corresponding to the shape and the size of the inner hole of the door body 14*a*.

The closing part 14*b* is provided with a fixing tool 31, and the closing part 14*b* is fixed to the door body 14*a* by operating the fixing tool 31 in a state where the closing part 14*b* is inserted into the door body 14*a*. The closing part 14*b* is provided with a handle 32, and the closing part 14*b* can be removed from the door body 14*a* by pulling the handle 32 in a state where the fixing tool 31 is loosened.

The closing part 14*b* is a part of a sample holder 34 for fixing a sample W to the door 14. FIG. 1A shows an example in which a plurality of (three) sample holders 34 are provided, but the number of the sample holders 34 is only required to be one or more. That is, the number of the closing parts 14*b* is not limited to a plurality (three), and is only required to be one or more.

Figure 3:
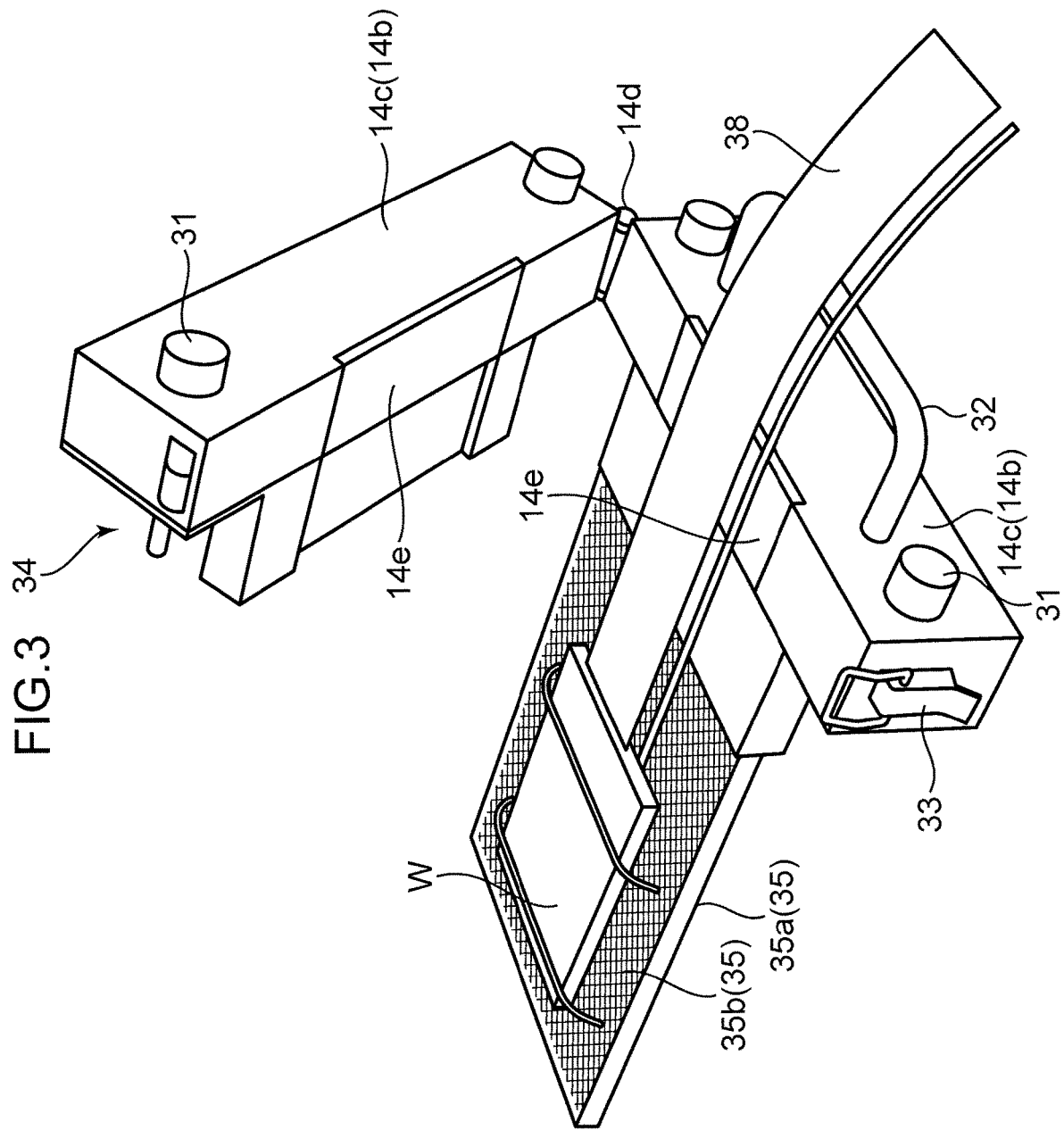
FIG. 3 is a view showing a sample holder used for the environment forming device.

As shown in FIG. 3, the sample holder 34 includes the closing part 14*b* and a reception portion 35 fixed to the closing part 14*b* and holding the sample W. The closing part 14*b* has a pair of clamping members 14*c*, and these clamping members 14*c* can be opened and closed by a hinge 14*d*. The clamping member 14*c* is also provided with a lock mechanism 33 for locking the pair of clamping members 14*c* in a closed state.

The pair of clamping members 14*c* are provided with a cutout part 14*e* for allowing a cable 38 (in FIG. 3, flat cable 38) connected to the sample W to pass through. When the cable 38 is placed along the cutout part 14*e* in a state where the pair of clamping members 14*c* are opened and the pair of clamping members 14*c* are closed in this state, the cable 38 is brought into a state of being passing through between the cutout parts 14*e* of the pair of clamping members 14*c*. The cutout part 14*e* may be provided with a buffer.

The reception portion 35 is fixed to an inner surface (alternatively, a surface facing the test space S1 in a state of being attached to the door body 14*a*) of the closing part 14*b*. In a state where the door 14 is closed, the reception portion 35 extends from the door body 14*a* into the test space S1.

The reception portion 35 includes a frame part 35*a* formed in a rectangular frame shape and a holding member 35*b* fixed to the frame part 35*a* and holding the sample W. The holding member 35*b* has a mesh shape or a porous shape, and can allow air to pass through. The sample W is arranged along the holding member 35*b*, and is attached to the holding member 35*b* by, for example, a string-like fixing member.

Figure 4:
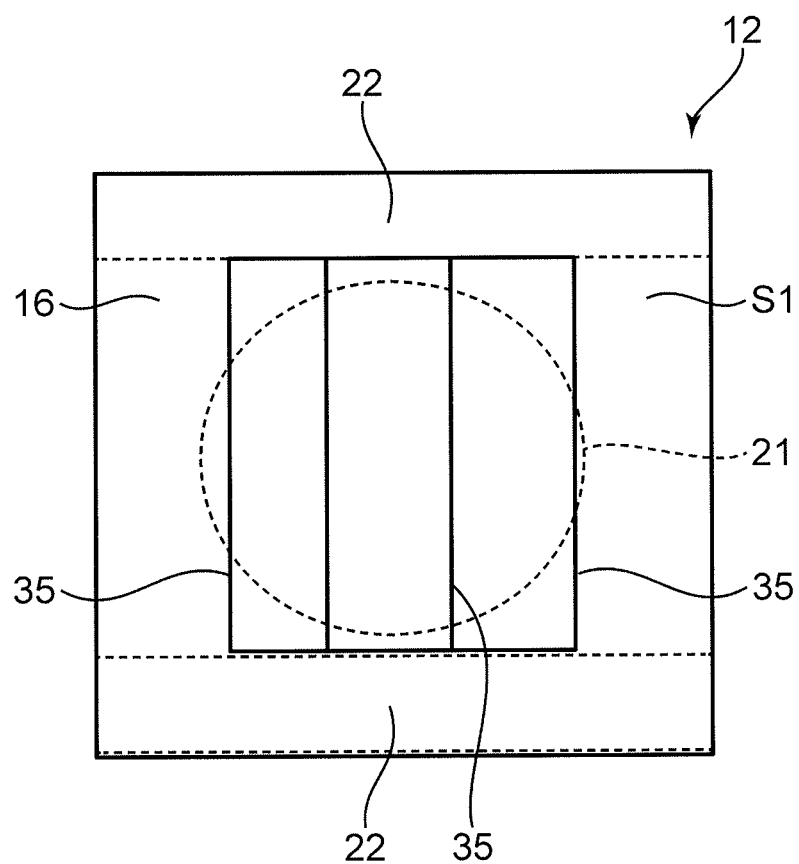
FIG. 4 is a view for describing a relationship among a blow-out port, a suction port, and a reception portion inside the environment forming device.

As shown in FIG. 1A, a plurality of the sample holders 34 are fixed to the door 14. The sample holders 34 are arranged such that each reception portion 35 is in a vertical posture and the plurality of reception portions 35 are aligned in the left-right direction. As shown in FIGS. 2 and 4, the blower 20 is arranged so as to oppose the door 14, and blows air toward the door 14. Each reception portion 35 is arranged in a posture extending in a direction connecting the blower 20 and the door 14. Therefore, the air blown out into the test space S1 by the blower 20 flows toward the door 14 along the reception portion 35. Then, in the vicinity of the door 14, the air changes its orientation upward or downward and flows rearward. The holding member 35*b* of each reception portion 35 is configured to allow air to pass through. Therefore, the air blown out from the blower 20 can not only flow along the reception portion 35 but also pass through the holding member 35*b* in the left-right direction.

As shown in FIGS. 1A and 1B, the door 14 is slidable with respect to the device body 12 by a slide mechanism 40. The slide mechanism 40 includes an extension member 40*a* having an elongated shape fixed to the door 14, and a holding portion 40*b* that slidably holds the extension member 40*a*.

The extension member 40*a* has one end part fixed to a side surface of the door 14 (door body 14*a*). That is, the extension member 40*a* is arranged at a position protruding in the width direction with respect to the door 14. The extension member 40*a* linearly extends horizontally rearward from the door 14. In the illustrated example, a pair of the extension members 40*a* are arranged separately on the left and right sides of the door 14. The extension member 40*a* on the left side is positioned outside (left side) of the left-side panel portion 26 constituting the device body 12, and the extension member 40*a* on the right side is positioned outside (right side) of the right-side panel portion 27. That is, the extension member 40*a* is positioned outside (opposite side to the air-condition space S2) relative to the heat insulating material provided in the device body 12.

The holding portion 40*b* holds the extension member 40*a* in such a manner to enable sliding movement, and is arranged on the device body 12. The holding portion 40*b* includes a cover 40*c* forming a space extending in the front-rear direction between an inner surface of the holding portion and an outer surface of a side surface of the device body 12, and a plurality of rolling elements (not illustrated) arranged in the cover 40*c*. The extension member 40*a* is inserted into a space defined by the cover 40*c* and the side surface of the device body 12. In the illustrated example, since the pair of left and right extension members 40*a* are provided, the holding portion 40*b* is also provided on each of the left and right of the device body 12. The holding portion 40*b* on the left side is attached to an outer surface (left side surface of the exterior) of the left-side panel portion 26, and the holding portion 40*b* on the right side is attached to an outer surface (right side surface of the exterior) of the right-side panel portion 27.

The holding portion 40*b* may include only the cover 40*c* extending in the front-rear direction without having rolling elements, or may include a plurality of rolling elements spaced apart in the front-rear direction without the cover 40*c*.

As shown in FIG. 1B, the extension member 40*a* is positioned below the reception portion 35 arranged on the door 14. That is, the upper end of the extension member 40*a* is positioned below the lower end of the reception portion 35. Therefore, when the sample W held by the reception portion 35 is accessed from the side, the extension member 40*a* does not hinder the work on the sample W. For example, when the user stands on the front side of the paper surface in FIG. 1B and performs confirmation work or the like of the sample W, the extension member 40*a* positioned on the front side of the paper surface in FIG. 1B does not hinder the work.

The extension member 40*a* is positioned below a center C of the door 14 in the height direction. The holding portion 40*b* holds the extension member 40*a* such that the extension member 40*a* is at this position. Therefore, even when the reception portion 35 holds the sample W and the door 14 is heavy, the holding portion 40*b* can stably slide the door 14. The extension member 40*a* may be positioned at the same height position as the center C of the door 14 in the height direction or above the center C of the door 14 in the height direction as long as the extension member 40*a* is positioned below the reception portion 35.

The device body 12 is provided with a lock 42 for locking door 14 to the device body 12. The lock 42 fixes the door 14 at a position in a state where the door 14 is in contact with the device body 12. When the lock 42 locks the door 14, the device body 12 and door 14 are airtightly sealed together.

The lock 42 is positioned above the center C of the door 14 in the height direction. More specifically, the lock 42 and the extension member 40a are arranged at positions symmetrical to each other with respect to the center C of the door 14 in the height direction as viewed from the side. As long as the lock 42 is positioned above the center C of the door 14 in the height direction, the lock 42 and the extension member 40a need not be arranged at positions symmetrical to each other with respect to the center C of the door 14 in the height direction.

As described above, in the present embodiment, the test space S1 of the device body 12 is opened and closed by sliding the door 14 with respect to the device body 12. At this time, the reception portion 35 arranged on the door 14 also moves integrally with the door 14. Therefore, when the door 14 is pulled out from the device body 12, the reception portion 35 is also pulled out from the test space S1 of the device body 12. In this state, the sample W arranged on the reception portion 35 can be accessed. At this time, the elongated extension member 40a fixed to the door 14 is positioned below the reception portion 35. Therefore, the extension member 40a does not hinder the work even when the user stands beside the environment forming device 10 and accesses, from the side, the sample W held by the reception portion 35.

In the present embodiment, the extension member 40a is positioned below the center C of the door 14 in the height direction. Therefore, the door 14 can be stably supported even when the sample W is arranged on the reception portion 35 and a load is applied to the reception portion 35 and the extension member 40a.

In the present embodiment, the lock 42 is positioned above the center C of the door 14 in the height direction. Therefore, when the door 14 is closed, the door 14 is supported with respect to the device body 12 by the extension member 40a positioned below the center C of the door 14 in the height direction and the lock 42 positioned above the center C of the door 14 in the height direction. This can stabilize the support of the door 14.

In the present embodiment, the holding portion 40b holds the extension member 40a in a state where the extension member 40a is positioned outside relative to the heat insulating material accommodated in the device body 12. Therefore, even when the test space S1 is heated to a high temperature, the extension member 40a is hardly affected by that. Therefore, even if a part of the body of the user touches the extension member 40a when the user accesses the sample W in a state where the door 14 is pulled out from the device body 12, there is a low possibility of burns.

In the present embodiment, the reception portion 35 is fixed to the closing part 14b of the door 14 and is arranged so as to extend into the test space S1. Therefore, by removing, from the door body 14a, the closing part 14b to which the reception portion 35 is fixed, it is also possible to remove the reception portion 35 from the door body 14a. Therefore, the sample W can be arranged on the reception portion 35 removed from the door body 14a. It is also possible to access the sample W held by the reception portion 35 in a state where the closing part 14b is attached to the door body 14a.

It should be understood that the embodiment disclosed herein is illustrative in all respects and not restrictive. The present invention is not limited to the above-described embodiment, and various changes, improvements, and the like can be made without departing from the scope thereof.

For example, in the above embodiment, the door 14 includes the door body 14a formed in an annular shape and the closing part 14b inserted into the door body 14a. However, the door 14 is not limited to have the configuration including the door body 14a provided with the inner hole for providing the sample holder 34. For example, as shown in FIGS. 5A and 5B, the reception portion 35 may be fixed to the inner surface of the door 14, and the door 14 may be provided with a through hole 14f for passing a cable (not illustrated) connected to the sample arranged in the reception portion 35. In this case, a plug member 44 that closes the through hole 14f may be provided. Also in this configuration, the reception portion 35 is positioned above the extension member 40a. The through hole 14f is also positioned above the extension member 40a. The plurality of reception portions 35 may be provided, and in this case, the lowermost reception portion 35 is also positioned above the extension member 40a.

The through hole 14f may be provided in the embodiment shown in FIGS. 1A and 1B. That is, the through hole 14f may be provided in the form in which the door 14 includes the door body 14a formed in an annular shape and the closing part 14b inserted into the inside of the door body 14a. In this case, the through hole 14f may be formed in the door body 14a or may be formed in the closing part 14b.

As shown in FIGS. 6A, 6B, 7A, and 7B, the door 14 may be provided with connectors 46 and 47. FIGS. 6A and 6B show an example in which a card edge connector 46 is provided in the door 14, and the through hole 14f for passing the cable is provided in the door 14. The card edge connector 46 provided on the outer surface of the door 14 connect a cable (not illustrated) to be connected to an external measuring instrument, tester, or the like. A cable (not illustrated) connected to the sample arranged in the reception portion 35 is connected to this card edge connector 46. The cable (not illustrated) connecting an external measuring instrument or the like and the sample can be passed through the through hole 14f. The reception portion 35 is positioned below the card edge connector 46 and the through hole 14f. In the embodiment shown in FIGS. 6A and 6B, the through hole 14f can be omitted.

FIGS. 7A and 7B show an example in which a plurality of BNC connectors 47 are provided on the door 14. A cable (not illustrated) to be connected to an external measuring instrument, an analyzer, or the like can be connected to the BNC connector 47 provided on the outer surface of the door 14. A cable (not illustrated) connected to the sample arranged on the reception portion 35 can be connected to the BNC connector 47 provided on the inner surface of the door 14. The extension member 40a is positioned below the reception portion 35, and the reception portion 35 is positioned below the BNC connector 47. The sample W may be directly connected to the BNC connector 47 without a cable. The through hole 14f may be provided.

The card edge connector 46 or the BNC connector 47 may be provided in the embodiment shown in FIGS. 1A and 1B. That is, the card edge connector 46 or the BNC connector 47 may be provided in the form in which the door 14 includes the door body 14a formed in an annular shape and the closing part 14b inserted into the inside of the door body 14a. For example, half of the door 14 may have the annular door body 14a and the closing part 14b, and the other half may be provided with the connectors 46 and 47. In this configuration, the through hole 14f may be further provided.

In the above embodiment, the pair of extension members 40a are arranged separately on the left and right sides of the door 14 and fixed to the lower part of the side surface of the door 14, but the present embodiment is not limited to this configuration. For example, as shown in FIGS. 8A and 8B, the pair of extension members 40a may be fixed in the vicinity of both of the left and right ends of the bottom surface of the door 14. In this case, the extension member 40a may be inserted into the holding portion 40b provided on the lower side of the bottom panel portion 25. One extension member 40a formed wide may be fixed to the center of the bottom surface of the door 14. In this case, the extension member 40a is fixed to the lower end part of the lower surface or the inner surface of the door 14. A machine chamber 48 in which a refrigerator (not illustrated) or the like is arranged may be provided below the device body 12. Also a machine chamber 49 may be disposed on the back side of the backside panel portion 28.

Figure 9:
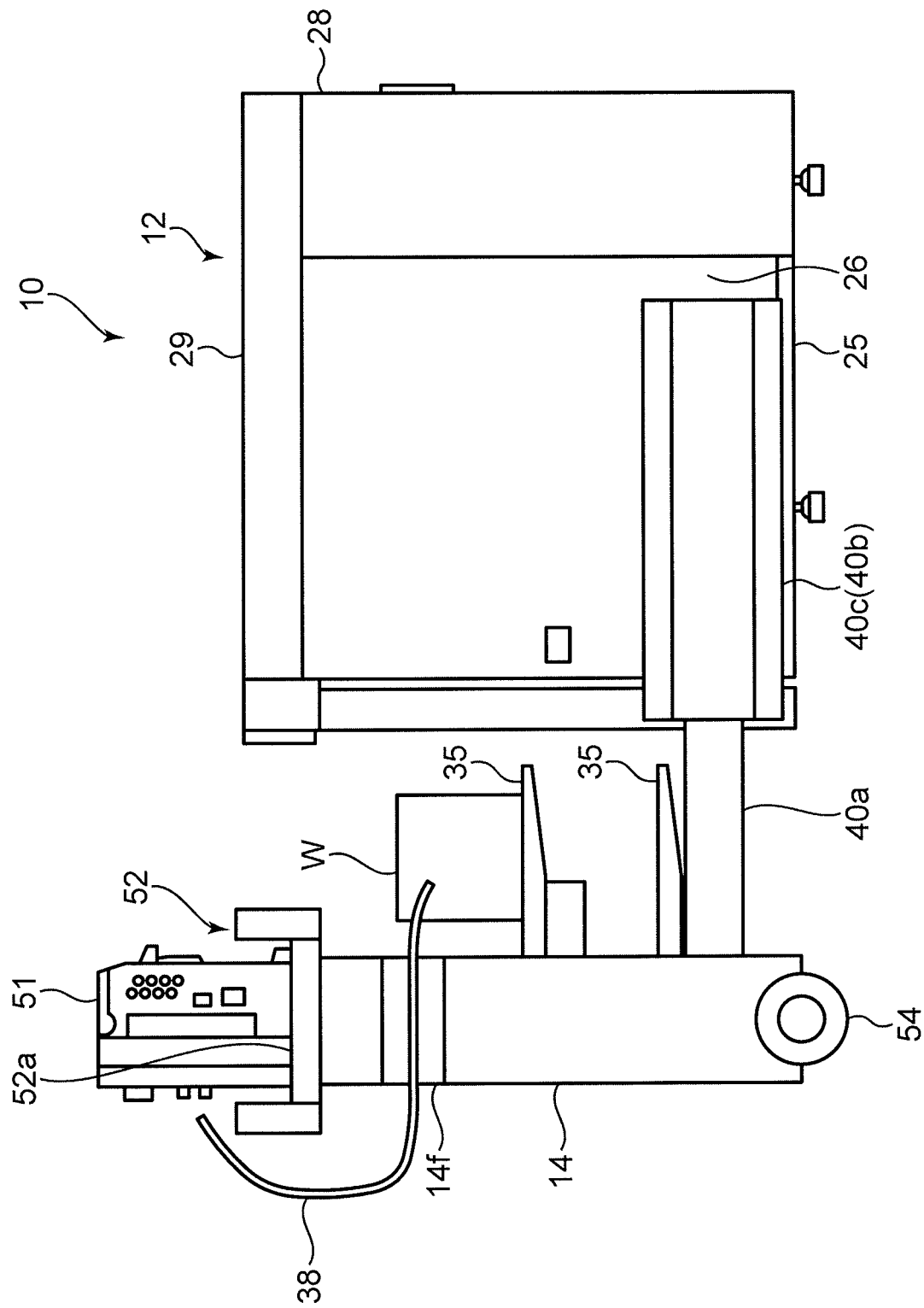
FIG. 9 is a side view of an environment forming device according to another embodiment.

As shown in FIG. 9, the door 14 may be provided with a placement portion 52 for holding a measuring instrument 51. The cable 38 connected to the sample W is connected to the measuring instrument 51. The placement portion 52 is fixed to the upper surface of the door 14 and has a placement surface 52a on which the measuring instrument 51 is placed. In FIG. 9, the inner end of the placement portion 52 protrudes toward the device body 12 side relative to the inner surface of the door 14, and therefore the device body 12 is provided with a recess (not illustrated) so as not to hinder the placement portion 52. The placement portion 52 may be positioned above the device body 12 when the door 14 is closed. In this configuration, there is no need to provide the device body 12 with the recess. The placement portion 52 may have a configuration in which an inner end thereof does not protrude from the inner surface of the door 14 on the device body 12 side. For example, the placement portion 52 may be fixed to the outer surface of the door 14.

The door 14 is provided with the through hole 14f for passing the cable 38 connecting the measuring instrument 51 placed on the placement portion 52 and the sample W arranged on the reception portion 35.

In this configuration, since the measuring instrument 51 is held by the door 14, not only the sample W but also the measuring instrument 51 moves together when the door 14 is slid. Therefore, the relative positional relationship between the sample W and the measuring instrument 51 does not change even when the door 14 slides. Therefore, it is possible to avoid a situation in which the cable 38 is pulled by the sliding movement of the door 14. The placement portion 52 for the measuring instrument 51 can be adopted for any of the doors 14 in FIGS. 1A and 5A to 7B.

The door 14 is provided with a roller 54 that assists sliding movement of the door 14 by rolling along the floor. This configuration allows the door 14 to smoothly slide with respect to the device body 12 even when the door 14 becomes heavy by arranging the sample W on the reception portion 35.

Figure 10:
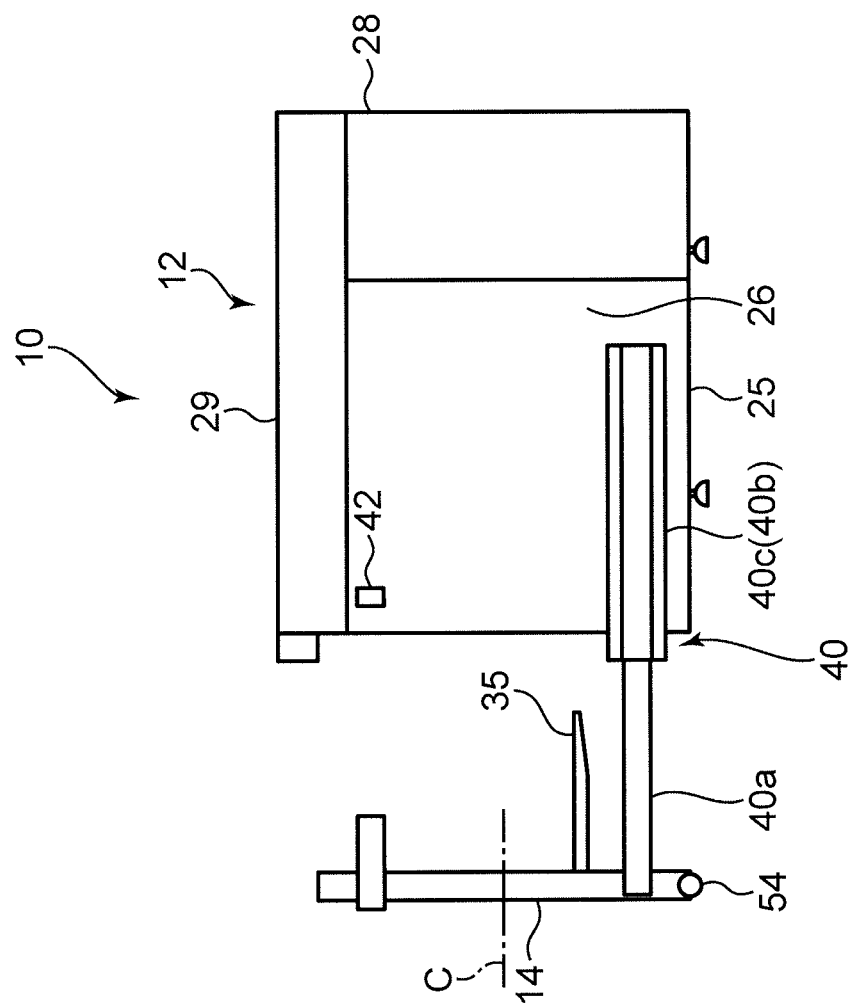
FIG. 10 is a side view of an environment forming device according to another embodiment.
Figure 11:
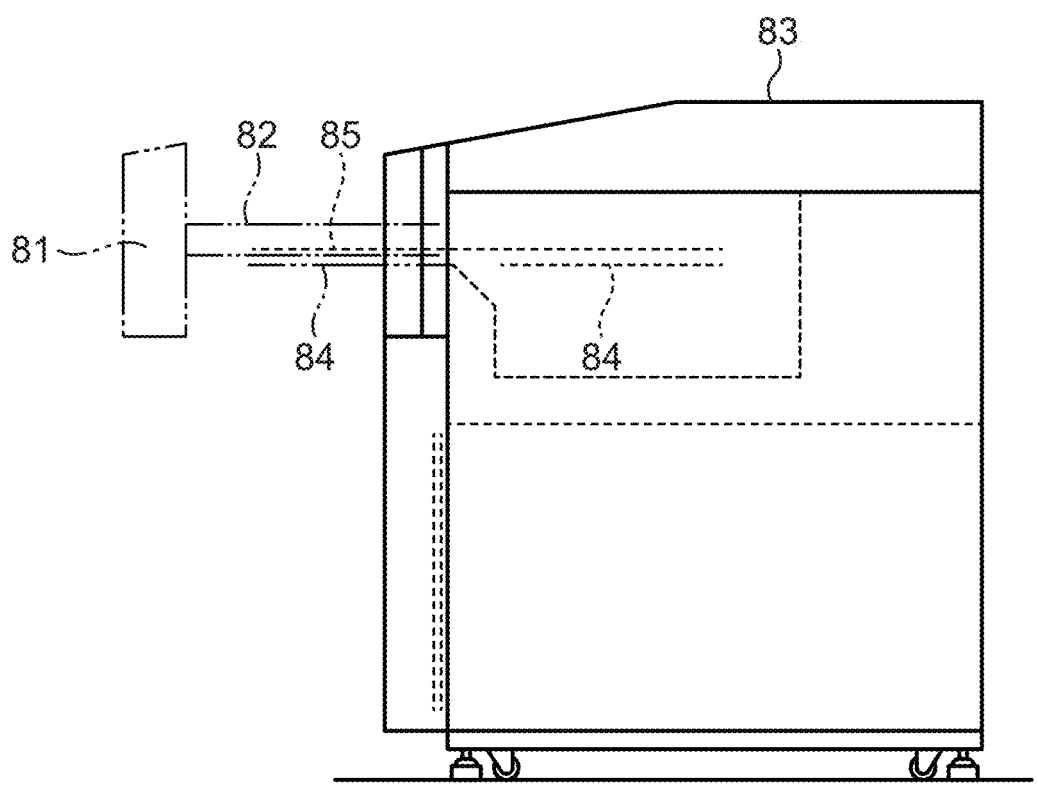
FIG. 11 is a view showing a conventional environment forming device.

As shown in FIG. 10, the roller 54 that assists the sliding movement of the door 14 can also be adopted in the door 14 not provided with the placement portion 52 for the measuring instrument 51. That is, the roller 54 can be adopted for any of the doors 14 in FIGS. 1A, 1B, and 5A to 7B. This is because since the door 14 is provided with the reception portion 35 for the sample W, the door 14 can become heavy when the sample W is placed on the reception portion 35.

The embodiment will now be outlined.
(1) An environment forming device according to the above embodiment includes: a device body having a space for generating a predetermined environment; a door; and a slide mechanism that makes the door slidable with respect to the device body so as to open and close the space. The slide mechanism includes an extension member having an elongated shape fixed to the door, and a holding portion that is arranged on the device body and slidably holds the extension member. The environment forming device further includes a reception portion that is arranged on the door such that a sample is arranged in the space in a state where the door closes the space, and receives the sample. The extension member is positioned below the reception portion.

In the environment forming device according to the above embodiment, when the door slides with respect to the device body, the space in the device body is opened and closed by the door. At this time, the reception portion for the sample arranged on the door also moves integrally with the door. Therefore, when the door is pulled out from the device body, the reception portion arranged on the door is also pulled out from the space of the device body. In this state, the sample arranged on the reception portion can be accessed. At this time, since the elongated extension member fixed to the door is positioned below the reception portion for the sample, the extension member does not hinder the work even when the user stands beside the environment forming device and accesses the sample on the reception portion from the side.

(2) The extension member may be positioned below a center of the door in the height direction. In this aspect, the door can be stably supported even when the sample is arranged on the reception portion and a load is applied to the reception portion and the extension member.

(3) The environment forming device may further include a lock for locking the door to the device body. In this case, the lock may be positioned above the center of the door in the height direction. In this aspect, when the door is in a state of closing the space, the door is supported with respect to the device body by the extension member positioned below the center of the door in the height direction and the lock positioned above the center of the door in the height direction. This can stabilize the support of the door.

(4) The lock and the extension member may be arranged at positions symmetrical to each other with respect to the center of the door in the height direction. In this aspect, it is possible to more stabilize the support of the door.

(5) The device body may include an exterior, an interior, and a heat insulating material arranged between the exterior and the interior, and has a box shape having one opening. In this case, the holding portion may hold the extension member in a state where the extension member is positioned outside relative to the heat insulating material.

In this aspect, the extension member is positioned outside relative to the heat insulating material provided in the device body. That is, the extension member is positioned on the side opposite to the space in the device body with respect to the heat insulating material. Therefore, even when the space in the device body is heated to a high temperature, the extension member is hardly affected by that. Therefore, even if a part of the body of the user touches the extension member when the user accesses the sample in a state where the door is pulled out from the device body, there is a low possibility of burns.

(6) The door may be provided with a roller that rolls along the floor to assist sliding movement of the door. In this aspect, since the roller assists sliding movement of the door, the door can smoothly slide with respect to the device body even when the door becomes heavy by arranging the sample on the reception portion.

(7) The door may include a door body formed in an annular shape, and a closing part that is detachable to the door body and is inserted inside the door body to close an inner hole of the door body. In this case, the reception portion may be fixed to the closing part and arranged to extend into the space.

In this aspect, by removing, from the door body, the closing part to which the reception portion is fixed, it is possible to remove the reception portion itself from the door body. Therefore, the sample can be arranged on the reception portion removed from the door body. It is also possible to access the sample on the reception portion in a state where the closing part is attached to the door body.

(8) The door may be provided with a through hole for passing a cable to be connected to the sample. In this aspect, it is possible to insert a cable into the through hole of the door, and connect this cable to the sample arranged on the reception portion. This connection work can be performed in a state where the door is pulled out from the device body. Therefore, it is possible to avoid the connection work of the cable to the sample arranged in the reception portion from becoming complicated.

(9) The door may be provided with a connector for connecting the sample itself or a cable connected to the sample. In this aspect, in a state where the door is pulled out from the device body, it is possible to connect the sample itself to the connector of the door or it is possible to connect the cable connected to the sample to the connector.

(10) The door may be provided with a placement portion on which a measuring instrument, to which a cable connected to the sample is connected, is placed. In this aspect, since the measuring instrument is held by the door, not only the sample but also the measuring instrument moves together when the door is slid. Therefore, the relative positional relationship between the sample and the measuring instrument does not change even when the door slides. Therefore, it is possible to avoid a situation in which the cable is pulled by the sliding movement of the door.

As described above, in the environment forming device having the sliding door, the rail fixed to the door does not hinder when the sample is accessed.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

The invention claimed is:

1. An environment forming device comprising:
a device body having a space configured for generating a predetermined environment;
a door; and
a slide mechanism that makes the door slidable with respect to the device body so as to open and close the space,
wherein the slide mechanism includes an extension member having an elongated shape fixed to the door, and a holding portion that is arranged on the device body and slidably holds the extension member,
the environment forming device further comprises
a reception portion that is arranged on the door such that a sample is arranged in the space in a state where the door closes the space, and receives the sample, and
the extension member is positioned below the reception portion,
wherein the door includes a door body formed in an annular shape, and a closing part that is detachable to the door body and is inserted inside the door body to close an inner hole of the door body, and
the reception portion is fixed to the closing part and arranged to extend into the space.

2. The environment forming device according to claim 1, wherein the extension member is positioned below a center of the door in a height direction.

3. The environment forming device according to claim 2, further comprising a lock configured for locking the door to the device body,
wherein the lock is positioned above the center of the door in the height direction.

4. The environment forming device according to claim 3, wherein the lock and the extension member are arranged at positions symmetrical to each other with respect to the center of the door in the height direction.

5. The environment forming device according to claim 1, wherein
the device body includes an exterior, an interior, and a heat insulating material arranged between the exterior and the interior, and has a box shape having one opening, and
the holding portion holds the extension member in a state where the extension member is positioned outside relative to the heat insulating material.

6. The environment forming device according to claim 1, wherein the door is provided with a roller that rolls along a floor to assist sliding movement of the door.

7. An environment forming device comprising:
a device body having a space configured for generating a predetermined environment;
a door; and
a slide mechanism that makes the door slidable with respect to the device body so as to open and close the space,
wherein the slide mechanism includes an extension member having an elongated shape fixed to the door, and a holding portion that is arranged on the device body and slidably holds the extension member,
the environment forming device further comprises
a reception portion that is arranged on the door such that a sample is arranged in the space in a state where the door closes the space, and receives the sample, and
the extension member is positioned below the reception portion,
wherein the door is provided with a through hole configured for passing a cable to be connected to the sample, the through hole passing through between an inner surface of the door and an outer surface of the door.

8. An environment forming device comprising:
a device body having a space configured for generating a predetermined environment;
a door; and
a slide mechanism that makes the door slidable with respect to the device body so as to open and close the space,
wherein the slide mechanism includes an extension member having an elongated shape fixed to the door, and a holding portion that is arranged on the device body and slidably holds the extension member, the environment forming device further comprises
a reception portion that is arranged on the door such that
a sample is arranged in the space in a state where the
door closes the space, and receives the sample, and
the extension member is positioned below the reception
portion,
wherein the door is provided with a connector configured
for connecting the sample itself or a cable connected to
the sample.

9. An environment forming device comprising:
a device body having a space configured for generating a
predetermined environment;
a door; and
a slide mechanism that makes the door slidable with
respect to the device body so as to open and close the
space,
wherein the slide mechanism includes an extension member having an elongated shape fixed to the door, and a
holding portion that is arranged on the device body and
slidably holds the extension member,
the environment forming device further comprises
a reception portion that is arranged on the door such that
a sample is arranged in the space in a state where the
door closes the space, and receives the sample, and
the extension member is positioned below the reception
portion,
wherein the door is provided with a placement portion on
which a measuring instrument, to which a cable connected to the sample is connected, is placed.

* * * * *